United States Patent [19]
Doyle et al.

[11] Patent Number: 6,022,815
[45] Date of Patent: Feb. 8, 2000

[54] METHOD OF FABRICATING NEXT-TO-MINIMUM-SIZE TRANSISTOR GATE USING MASK-EDGE GATE DEFINITION TECHNIQUE

[75] Inventors: Brian S. Doyle, Cupertino; Chunlin Liang, San Jose; Peng Cheng, Campbell; Qi-De Qian, Santa Clara, all of Calif.

[73] Assignee: Intel Corporation, Santa Clara, Calif.

[21] Appl. No.: 08/775,412

[22] Filed: Dec. 31, 1996

[51] Int. Cl.$^7$ .............................................. H01L 21/3205
[52] U.S. Cl. ......................... 438/947; 438/286; 438/585
[58] Field of Search ................................... 438/947, 596, 438/587, 585, 286

[56] References Cited

U.S. PATENT DOCUMENTS

| | | | |
|---|---|---|---|
| 4,400,865 | 8/1983 | Goth et al. | 438/303 |
| 5,013,680 | 5/1991 | Lowrey et al. | 438/242 |
| 5,017,515 | 5/1991 | Gill | 438/128 |
| 5,593,813 | 1/1997 | Kim | 430/312 |
| 5,923,981 | 7/1999 | Qian | 438/284 |

OTHER PUBLICATIONS

Fiegna et al, "Scaling the MOS Transistor Below 0.1 um: Methodology, Device Structures, and Technology Requirements", TED Jun. 1995, p. 941.

Kimura et al, "Short–Channel–Effect–Supressed Sub 0.1 um Grooved–Gate MOSFET's with W Gate", TED Jan. 1995, p. 94.

J. T. Jhorstmann et al, "Characterizatin of Sub–100 nm–MOS Transistors Fabricated by Optical Lithographer and a Sidewall–Etchback Process" NME, Sep. 1995.

*Primary Examiner*—John F. Niebling
*Assistant Examiner*—John Murphy
*Attorney, Agent, or Firm*—Calvin E. Wells

[57] ABSTRACT

A method of fabricating minimum size and next-to-minimum size electrically conductive members using a litho-less process is disclosed. A substrate is provided, and a layer of gate dielectric material is formed on the substrate. A layer of electrically conductive material is formed over the gate dielectric material. A first mask is used to form a hard mask. A layer of first spacer material is deposited over the existing structures, and the layer of first spacer material is etched back to form spacers adjacent to the hard mask. The width of the first spacers determines the minimum size gate length. A layer of second spacer material is deposited over the existing structures, including the hard mask and first spacers. The layer of second spacer material is etched back to form a second set of spacers adjacent to the first spacers. The width of the first and second spacers together determine the next-to-minimum size gate length. A second mask is used to protect the portion of the second spacers which are to be used to define next-to-minimum size gates, and the unprotected second spacers and the hard mask are removed. The exposed electrically conductive material is removed. The remaining spacers are then removed, leaving minimum size and next-to-minimum size gates.

13 Claims, 12 Drawing Sheets

Cross-sectional view

Cross-sectional view

Top view

Cross-sectional view

Top view

Cross-sectional view

Cross-sectional view

Top view

Cross-sectional view

Top view

Cross-sectional view

Top view

Cross-sectional view

Top view

METHOD OF FABRICATING NEXT-TO-MINIMUM-SIZE TRANSISTOR GATE USING MASK-EDGE GATE DEFINITION TECHNIQUE

BACKGROUND OF THE INVENTION

1. Field of the Invention

The present invention pertains to the field of semiconductor processing. More particularly, this invention relates to the formation of the transistor gate.

2. Background of the Related Art

Metal oxide semiconductor (MOS) technology is used to form a number of different types of devices including memory devices and microprocessors. The basic device structure forming the field effect transistor (FET) comprises an insulated gate electrically overlaying a channel region between a source and drain. The gate is an electrically conductive material separated a small distance from the underlying silicon substrate via a thin insulating layer usually made of silicon oxide. The source and drain are formed in the silicon substrate by introducing dopants in controlled amounts to make the source and drain n-type or p-type relative to the surrounding silicon. The dopants for the source and drain are inserted into the silicon using diffusion or ion implantation, both processes which require subjecting the substrate to high temperatures.

Early transistor structures were formed by first diffusing dopants into the source and drain regions and afterward forming the gate. The formation of the gate was done by depositing gate material and subsequently doing conventional photolithography patterning. Because of the need to ensure that the gate overlay the entire channel region and limitations in manufacturing tolerances, high volume manufacturing required a significant gate overlap into the source and drain to ensure that the gate adequately covered the entire channel region. For smaller device sizes the gate overlap led to significant parasitic capacitance between the gate and source region and the gate and drain region. A self-aligning manufacturing process was then developed whereby the gate itself would serve as a mask for forming the source and drain. The gate had to be formed first, so that the source and drain could be formed in alignment with the gate. A consequence of the self-aligned process was that the gate material had to be changed from metal to silicon because of the requirement that the gate withstand the high temperature processing for forming the source and drain.

In an effort to achieve smaller than 100 nm gate lengths, a process was developed whereby conventional photolithography is used to define edges onto which the dimensions of the future gate is established. This process is referred to as "litho-less". An example of this process is shown in FIG. 1. FIG. 1 a shows a silicon substrate 130. A layer of gate dielectric 120, comprising silicon oxide, is formed on the substrate 130. A layer of polycrystalline silicon (polysilicon) 110 is formed on the gate dielectric 120. In FIG. 1b, sacrificial oxide 140, comprising silicon oxide, is formed on the polysilicon. The sacrificial oxide is patterned using conventional photolithography. A layer of silicon nitride 150 is formed, as shown in FIG. 1c. FIG. 1d discloses that the silicon nitride 150 is etched to create spacers 153 and 155. The sacrificial oxide 140 and spacer 155 are removed, leaving spacer 153, as depicted in FIG. 1e. FIG. 1f shows that the exposed portion of the polysilicon 110 is removed, forming the future transistor gate 111. FIG. 1g indicates that the nitride spacer 153 is removed, exposing the remaining polysilicon, thus forming the transistor gate 111. The remainder of the transistor structure is formed using standard CMOS process.

The above litho-less process yields a minimum size transistor gate. The gate length is determined by the width of the nitride spacer 153, and the location of the gate is determined by the placement of the sacrificial oxide 140. The litho-less process gives only one effective gate length determined by the spacer thickness. The next gate length up from the minimum size is for gates defined by photolithography. The gap between the gate formed by the litho-less process and the smallest gate formed by lithography is called the "forbidden gap". The length of the litho-less gate is far smaller than that formed by lithography. This leaves a large range of transistor gate lengths within the forbidden gap that cannot be fabricated. The circuit designer is thus restricted to using the minimum size litho-less gate length or using the much larger gate lengths available using lithography. Therefore, a method for fabricating a minimum size gate and a next-to-minimum size gate using a litho-less process is desirable.

SUMMARY OF THE INVENTION

A method of forming a minimum size and a next-to-minimum size electrically conductive member using a litho-less process is disclosed. A minimum size electrically conductive member is formed using a first spacer formed from a first spacer material. A next-to-minimum size electrically conductive member is formed using a second spacer that is formed using the first spacer material and a second spacer material.

BRIEF DESCRIPTION OF THE DRAWINGS

FIG. 2f-2 is a top-view depiction of the first spacer material having been anisotropically etched in accordance with the teachings of the present invention.

FIG. 2h-1 is a side-view depiction of the layer of second spacer material having been anisotropically etched in accordance with the teachings of the present invention.

FIG. 2h-2 is a top-view depiction of the layer of second spacer material having been anisotropically etched in accordance with the teachings of the present invention.

FIG. 2i-1 is a side-view depiction of a photoresist mask formed in alignment with one of a first pair of spacers and masking one of a second set of spacers in accordance with the teachings of the present invention.

FIG. 2i-2 is a top-view depiction of a photoresist mask formed in alignment with one of a first pair of spacers and masking one of a second pair of spacers in accordance with the teachings of the present invention.

FIG. 2j-1 is a side-view depiction of the mask and one of the second pair of spacers having been removed in accordance with the teachings of the present invention.

FIG. 2j-2 is a top-view depiction of the mask and one of the second pair of spacers having been removed in accordance with the teachings of the present invention.

FIG. 2k-1 is a side-view depiction of the exposed portions of the layer of electrically conductive material having been removed in accordance with the teachings of the present invention.

FIG. 2k-2 is a top-view depiction of the exposed portions of the layer of electrically conductive material having been removed in accordance with the teachings of the present invention.

FIG. 2l-1 is a side-view depiction of the photoresist mask having been removed and the newly exposed portion of the layer of electrically conductive material also having been removed in accordance with the teachings of the present invention.

FIG. 2l-2 is a top-view depiction of the photoresist mask having been removed and the newly exposed portion of the layer of electrically conductive material also having been removed in accordance with the teachings of the present invention.

FIG. 2o-1 is a side-view depiction of the completed minimum-size and next-to-minimum size transistor gates implemented in accordance with the teachings of the present invention.

FIG. 2o-2 is a top-view depiction of the completed minimum-size and next-to-minimum size transistor gates implemented in accordance with the teachings of the present invention.

DETAILED DESCRIPTION

Figure 1A:
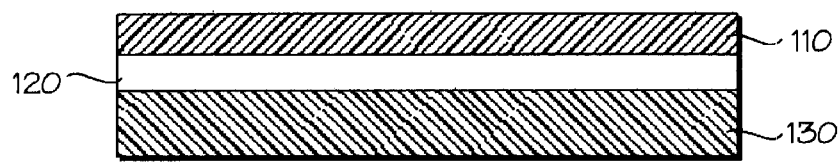
FIG. 1a is a side-view depiction of a substrate, a gate dielectric layer, and a layer of polysilicon implemented in accordance with the teachings of the related art.
Figure 1B:
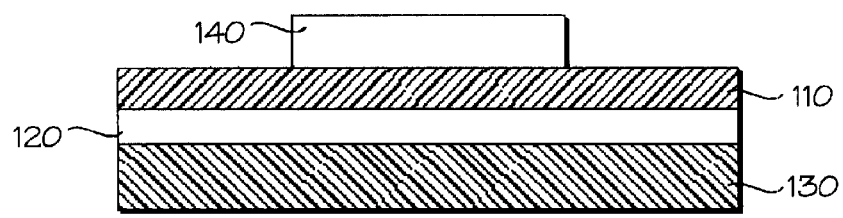
FIG. 1b is a side-view depiction of a mask formed on the layer of polysilicon in accordance with the teachings of the related art.
Figure 1C:
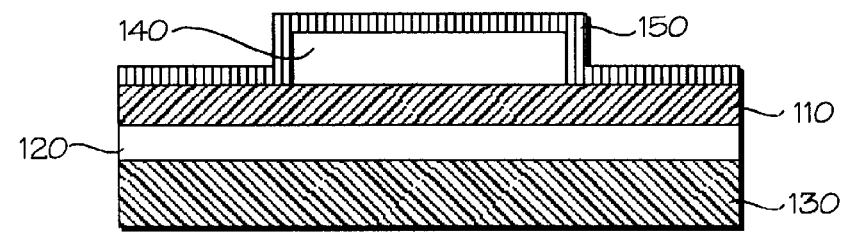
FIG. 1c is a side-view depiction of a layer of spacer material deposited over the existing structures in accordance with the teachings of the related art.
Figure 1D:
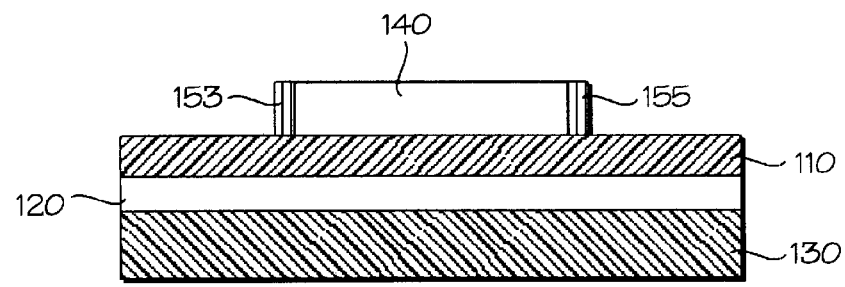
FIG. 1d is a side-view depiction of the spacer material having been anisotropically etched in accordance with the teachings of the related art.
Figure 1E:
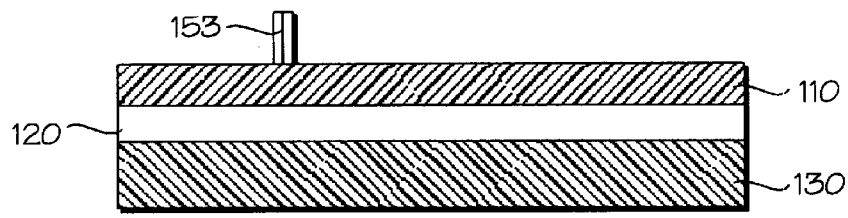
FIG. 1e is a side-view depiction of the mask and one spacer having been removed in accordance with the teachings of the related art.
Figure 1F:
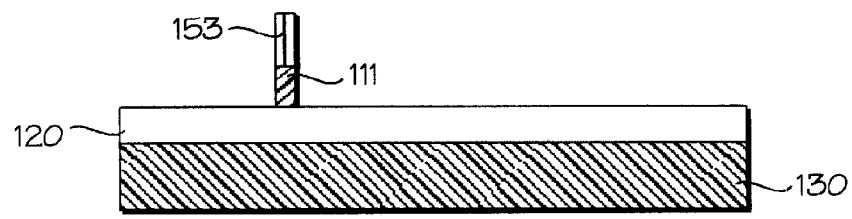
FIG. 1f is a side-view depiction of the layer of polysilicon having been etched in alignment with the spacer in accordance with the teachings of the related art.
Figure 1G:
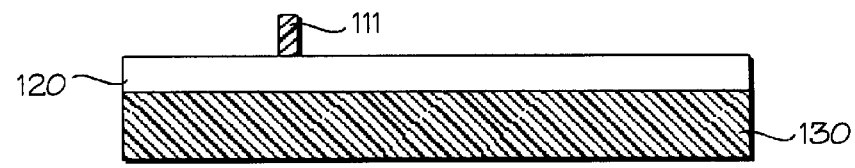
FIG. 1g is a side-view depiction of the transistor gate structure implemented in accordance with the teachings of the related art.

A novel method for fabricating a minimum size and a next-to-minimum size electrically conductive member in a semiconductor device using a single three-mask set and a litho-less process is disclosed. In the following description, for the purposes of explanation, specific details are set forth to provide a thorough understanding of the present invention. However, it will be obvious to one skilled in the art that these specific details are not required to practice the present invention. In other instances, well known structures and processes are not described in particular detail in order to avoid obscuring the present invention. Also, although the present invention is described in connection with the formation of transistor gates, the present invention may also be practiced in connection with the formation of any electrically conductive member in a semiconductor device.

The present invention solves the "forbidden gap" problem by allowing for the fabrication of two sub-lithographic gate lengths using a single "litho-less" three mask set. Sub-lithographic gate lengths are those lengths which are not achievable using a lithographic process. The two sub-lithographic gate lengths are referred to in this description as the minimum size gate length and the next-to-minimum size gate length. The availability of the next-to-minimum size gate length provided by the present invention allows for greater flexibility in circuit design and implementation. Where a particular circuit requires a gate size larger than the minimum size in order to provide a greater margin of error, the next-to-minimum size gate provided by the present invention can be used rather than using a much larger gate provided using conventional photolithography.

The "litho-less" three mask set includes the following masks: 1) a first mask to define the edges onto which the dimensions of the future gate is established; 2) a second mask for the definition of the polysilicon contact layer; and 3) a third mask for the removal of unwanted spacer.

In general, in accordance with an embodiment of the present invention, a gate dielectric is formed on a substrate. A layer of electrically conductive material is then formed over the gate dielectric. A layer of mask material is deposited and formed using the first mask to form a mask whose edges define the location of the future gates. A layer of spacer material is deposited and etched to form spacers on the edges of the mask. A second layer of spacer material is deposited and etched to form additional spacers adjacent to the spacers previously deposited. Next, the second mask is used to protect the additional spacer where a next-to-minimum length gate is desired. The exposed mask and additional spacers are removed, leaving the originally deposited spacers and the protected additional spacer. Also, exposed electrically conductive material is removed. The third mask is then used to remove unwanted remaining spacer material and electrically conductive material. The third mask is can be referred to as a "trim mask". Unwanted spacer material is that material that has been deposited and etched to form a spacer adjacent to the mask edge, but is not intended for use as a transistor gate. The unwanted spacer and electrically conductive material may cause undesirable short-circuits. Thus, the third or "trim" mask is used in a process to etch away the unwanted spacer or electrically conductive material. Next, the spacers are removed, exposing the minimum size and next-to-minimum size transistor gates. The remaining transistor structures are formed using well-known techniques.

Figure 2A:
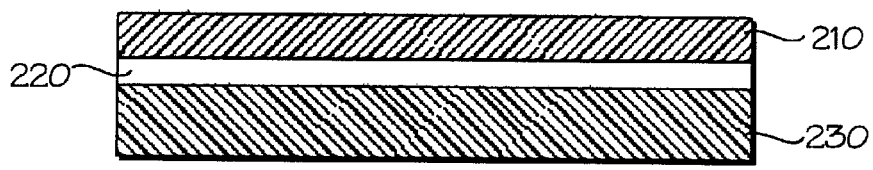
FIG. 2a is a side-view depiction of a substrate, a gate dielectric layer, and a layer of electrically conductive material implemented in accordance with the teachings of the present invention.

FIGS. 2a–2o depict a method for fabricating a minimum size transistor gate and a next-to-minimum size transistor gate implemented in accordance with the teachings of the present invention. FIG. 2a shows a substrate 230. In this example, the substrate 230 comprises silicon. Silicon formed on other substrates such as silicon oxide, aluminum oxide, or glass, on which integrated circuits can be built, can be used. A layer of gate dielectric 220, comprising, for example, silicon dioxide, is formed on the substrate 230. Examples of other possible gate dielectric materials are lead strontium, barium strontium, aluminum oxide, and tantalum pentoxide. A layer of nitrided oxide may also be used. The gate dielectric layer is preferably deposited to a thickness of between 20–50 angstroms (Å). A layer of electrically conductive material 210 is formed on the gate dielectric 220. In this example, the electrically conductive material 210 comprises polysilicon. The layer of polysilicon is preferably formed by a blanket deposition (that is, uniformly covering all surfaces) to the thickness of between 1000–3500 Å.

Figure 2B:
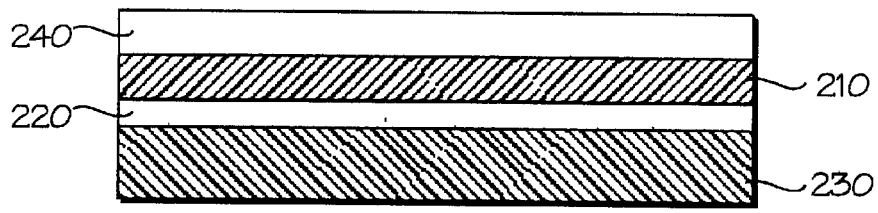
FIG. 2b is a side view depiction of a layer of mask material formed on the layer of electrically conductive material in accordance with the teachings of the present invention.

In FIG. 2b, a layer of hard mask material 240 is formed over the polysilicon. The preferred hard mask material in this example is silicon dioxide, formed by blanket deposition to the preferred thickness of 1800 Å. Other thicknesses are possible. The hard mask material 240 can be any material that can withstand high temperature processing and can be etched.

Figure 2C:
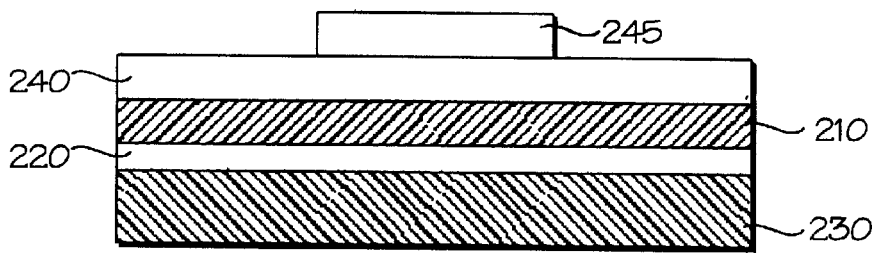
FIG. 2c is a side-view depiction of a photoresist mask formed on the layer of mask material in accordance with the teachings of the present invention.
Figure 2D:
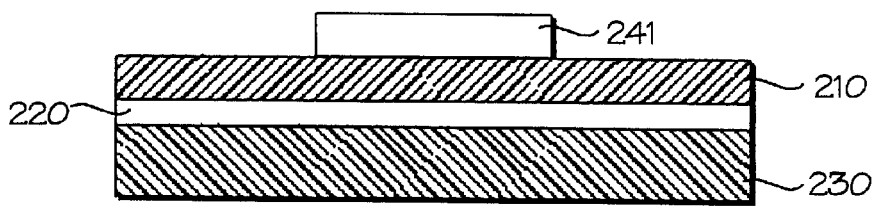
FIG. 2d is a side-view depiction of a hard mask formed on layer of electrically conductive material in accordance with the teaching of the present invention.

The hard mask 240 is typically patterned using a known photoresist lithography and plasma etching process, using the first mask. FIG. 2c depicts a photoresist mask 245. The photoresist mask 245 is used to form a hard mask 241, as shown in FIG. 2d. It is on the sidewalls of the hard mask 241 that the future gate hard mask will be formed, as discussed below. Therefore, it is the patterning of the hard mask material 240 that defines the location of the future gate structures.

Figure 2E:
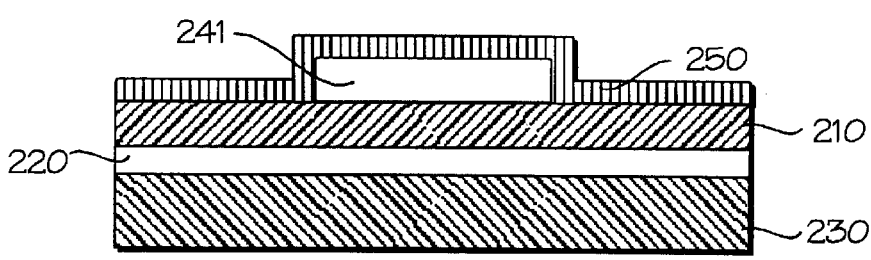
FIG. 2e is a side-view depiction of a layer of a first spacer material deposited over the existing structures in accordance with the teachings of the present invention.

Next, a layer of spacer material 250 is formed, as shown in FIG. 2e. The spacer material 250 is selected to be one that can withstand high temperature processing and can be etched, but is also different from the hard mask material 241. The spacer material 250 being different from the hard mask material 241 allows for selective etching of the hard mask material 241 without also etching the spacer material 250. The preferred spacer material 250 in this instance is silicon nitride. The silicon nitride 250 is blanket deposited, preferably using chemical vapor deposition. The silicon nitride 250 is deposited conformally so that the deposited silicon nitride 250 follows the shape of the hard mask material. The thickness of the deposited silicon nitride 250 will determine the length of the minimum size gate. Preferably, the thickness of the deposited silicon nitride 250 is 1000 Å or more. Smaller thicknesses are also possible.

Figures 1, 2F:
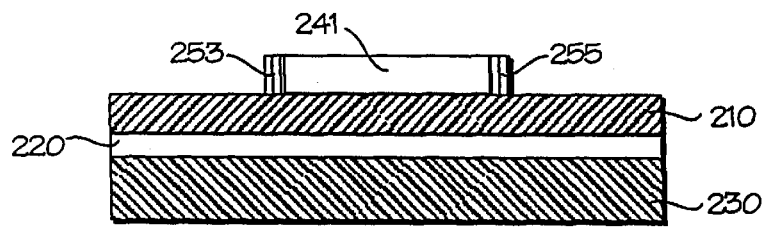
FIG. 2f-1 is a side-view depiction of the first spacer material having been anisotropically etched in accordance with the teachings of the present invention.
Figures 2, 2F:
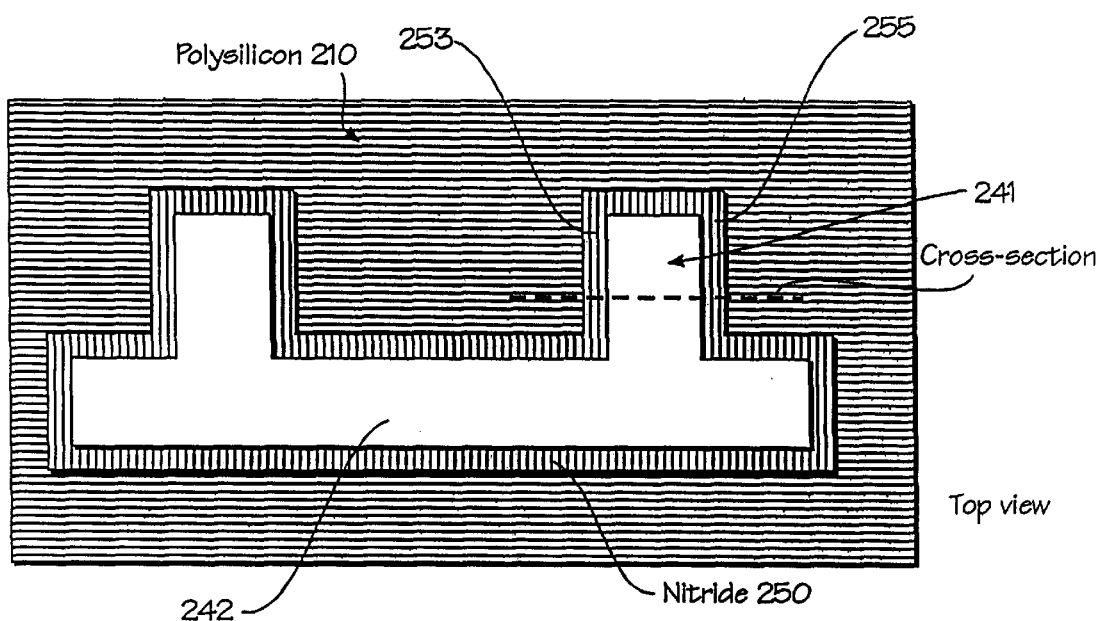

After the deposition of the spacer material 250, the spacer material is 250 anisotropically etched. The etching is preferably accomplished using a reactive ion etching (RIE) process. By etching anisotropically, the spacer material will be completely removed from the horizontal surfaces and a portion adjacent to each vertical edge of the hard mask 241 will remain to create spacers 253 and 255, as shown in FIG. 2f-1. FIG. 2f-2 shows a top view illustrating the hard mask 241 located between nitride spacers 253 and 255, the remainder of the hard mask 242, the remaining nitride 250, and the underlying polysilicon layer 210. The gate dielectric layer and the silicon substrate are hidden by the polysilicon layer 210.

Figure 2G:
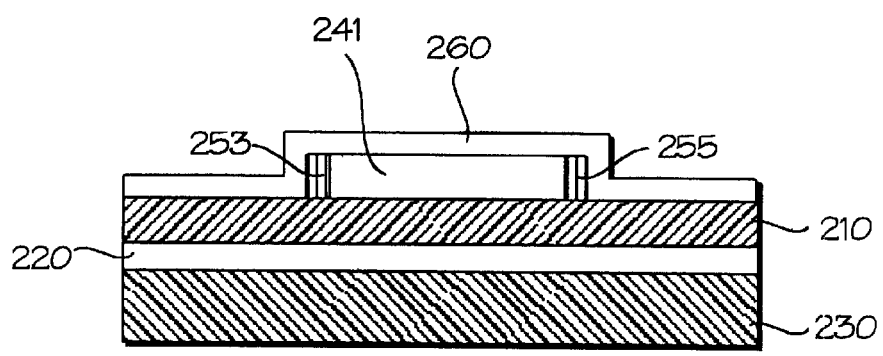
FIG. 2g is a side-view depiction of a layer of second spacer material deposited over the existing structures in accordance with the teachings of the present invention.

FIG. 2g shows that a second layer of spacer material 260 is formed over the existing structures, including the polysilicon layer 210, the spacers 253 and 255, and the hard mask 241. The preferred material for the second layer of spacer material 260 is silicon dioxide. The selection of silicon dioxide for the second spacer material 260 as well as the hard mask 241 allows the removal of the hard mask 241 and the unwanted portions of the second spacer material 260 to be removed in a single step. The silicon dioxide 260 is blanket deposited, preferably using chemical vapor deposition. The silicon dioxide 260 is deposited conformally so that the deposited silicon dioxide 260 follows the shape of the hard mask material 241 and the nitride spacers 253 and 255. The thickness of the deposited silicon dioxide 260 plus the thickness of the nitride spacers 253 and 255 will determine the length of the next-to-minimum size gate. Preferably, the thickness of the deposited silicon dioxide is between 10–20% of the thickness of the nitride spacers 253 and 255, or in other words, between 100–200 Å or larger. However, smaller thicknesses are also possible.

Figures 1, 2H:
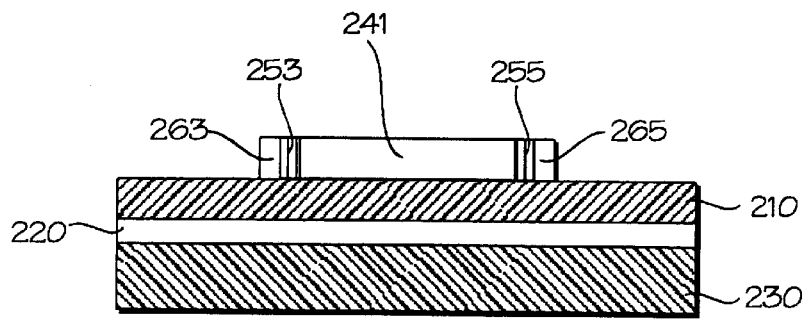
Figures 2, 2H:
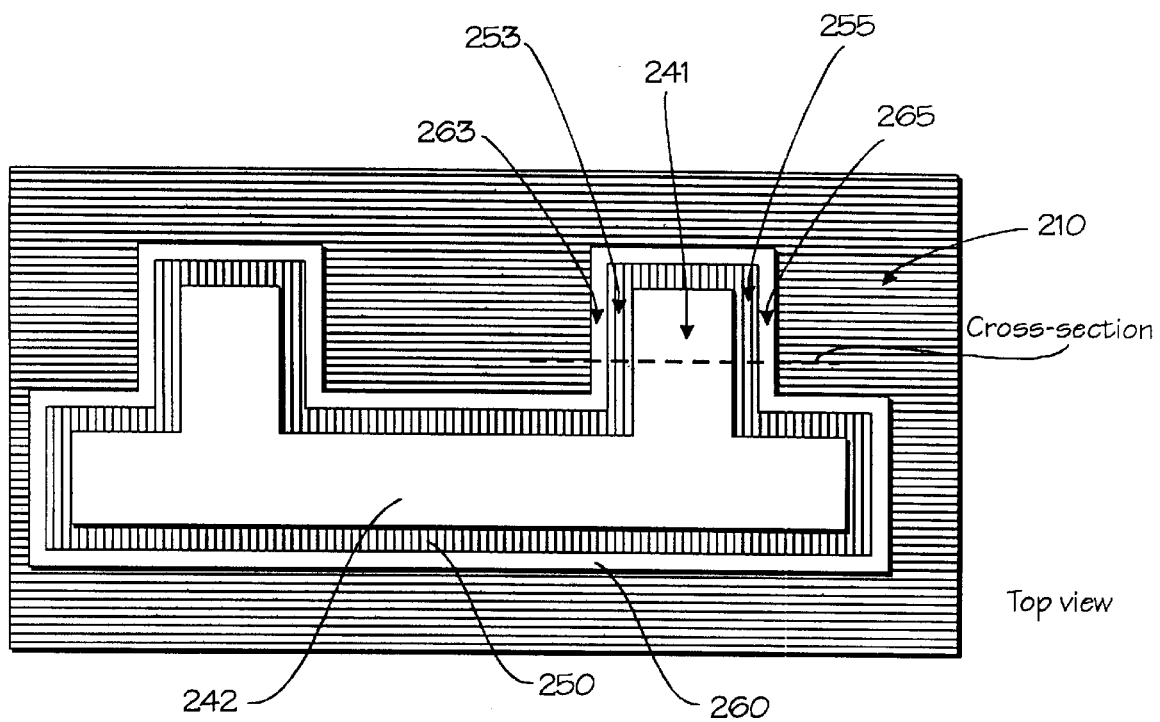

The second layer of spacer material 260 is anisotropically etched back to form spacers 263 and 265, as depicted in FIG. 2h-1 and FIG. 2h-2. If the preferred material of silicon oxide is used for the second spacer material, then a RIE process is preferred to form spacers 263 and 265. RIE etching of silicon oxide over silicon layers results in a selectivity ratio of 35:1 where plasma-only etching provides a selectivity ratio of 10:1. Selectivity relates to the preservation of the underlying surface during etching. A high selectivity ratio indicates little or no attack of the underlying surface.

Figures 1, 2I:
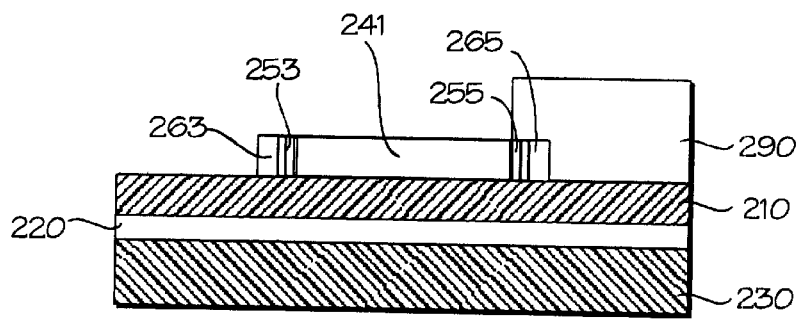
Figures 2, 2I:
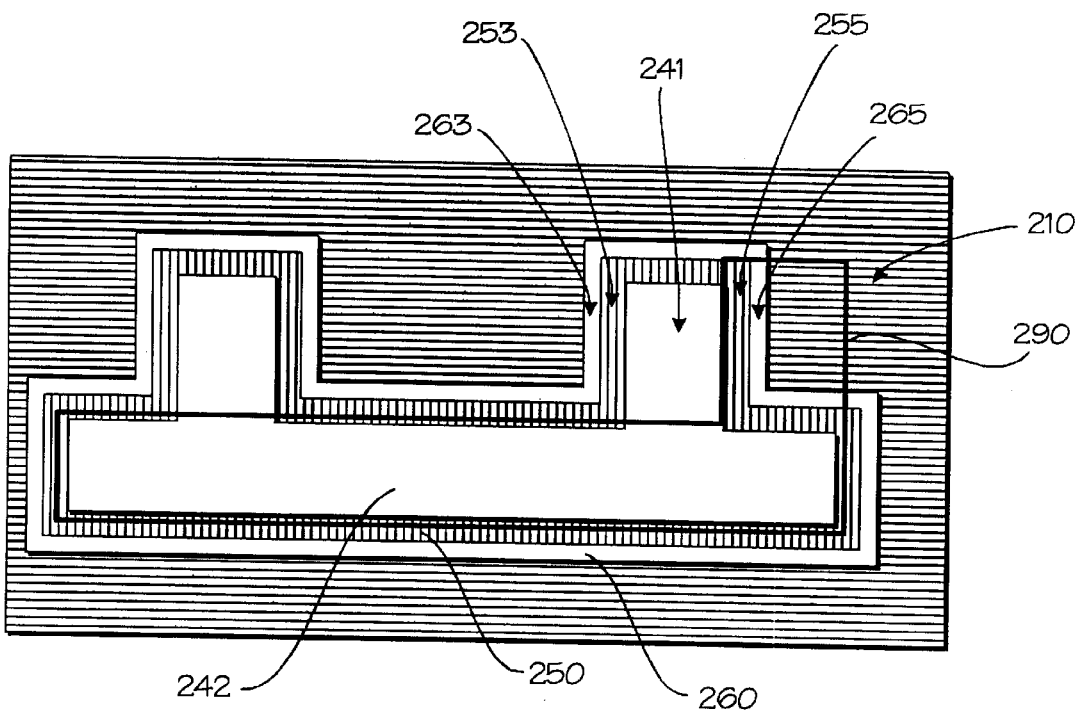
Figures 1, 2J:
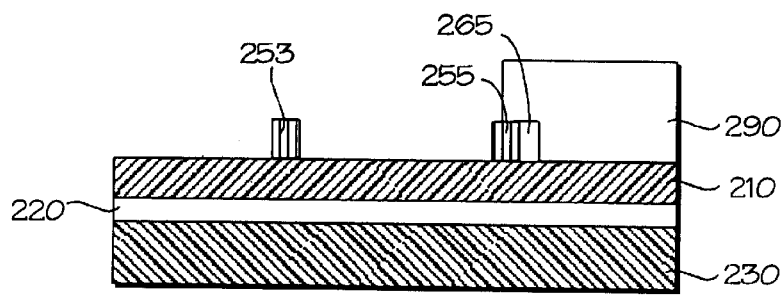
Figures 2, 2J:
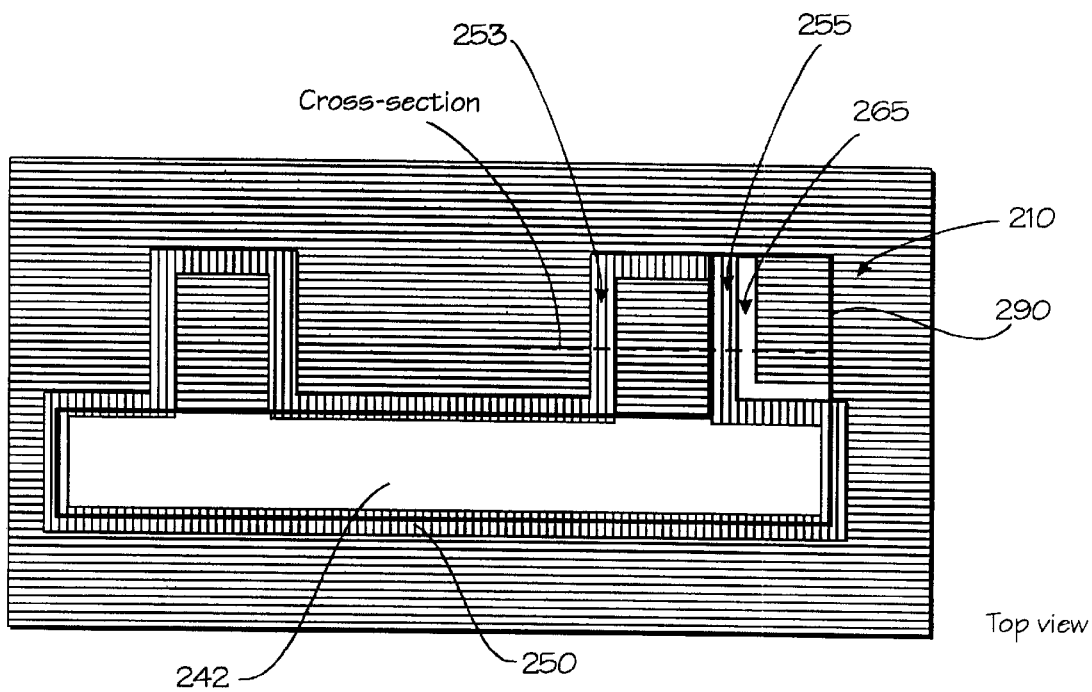

The next step of the present example involves the second mask 290, as shown in FIG. 2i-1 and FIG. 2i-2. The second mask is shown in a transparent manner in FIG. 2j-2 in order to reveal the underlying structures. The second mask is used to protect spacer 265 while the hard mask 241 and spacer 263 are removed. The second mask must be aligned with the spacer 255. Note that the second mask also protects the portion of the hard mask that covers the polysilicon contact area 242. The unprotected silicon dioxide, including portions of the hard mask 241 and the spacer 263, are removed. Because the first spacer material is chosen to be different from the hard mask material and the second spacer material is chosen to be the same as the hard mask material, the hard mask 241 and spacer 263 can be selectively removed in a single step. The resulting intermediate structure is shown in FIG. 2j-1 and FIG. 2j-2. Spacer 253 will serve as a hard mask for a minimum size gate and spacers 255 and 265 will serve as a hard mask for a next-to-minimum size gate.

Figures 1, 2K:
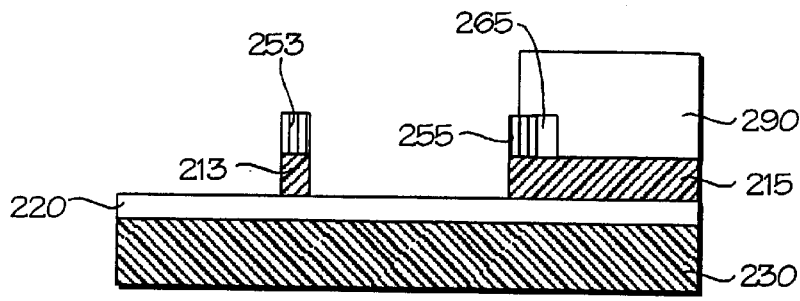
Figures 2, 2K:
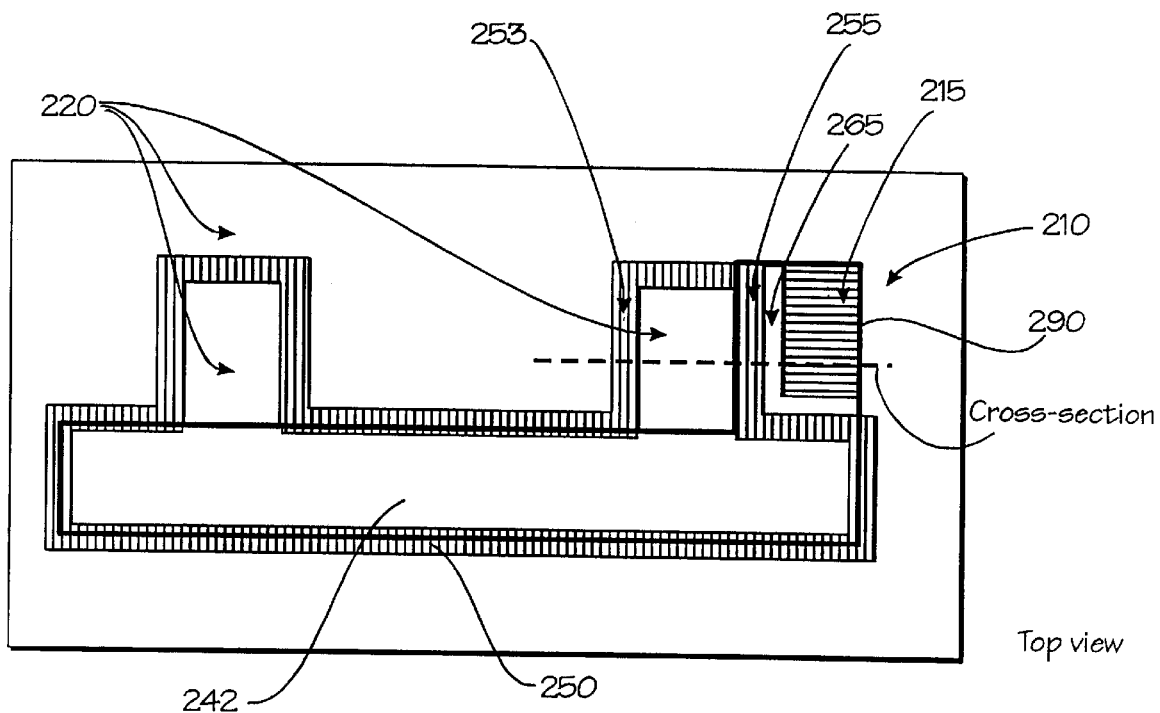
Figures 1, 21:
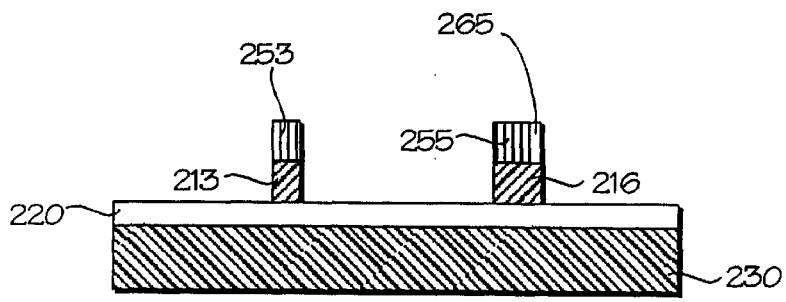
Figures 2, 21:
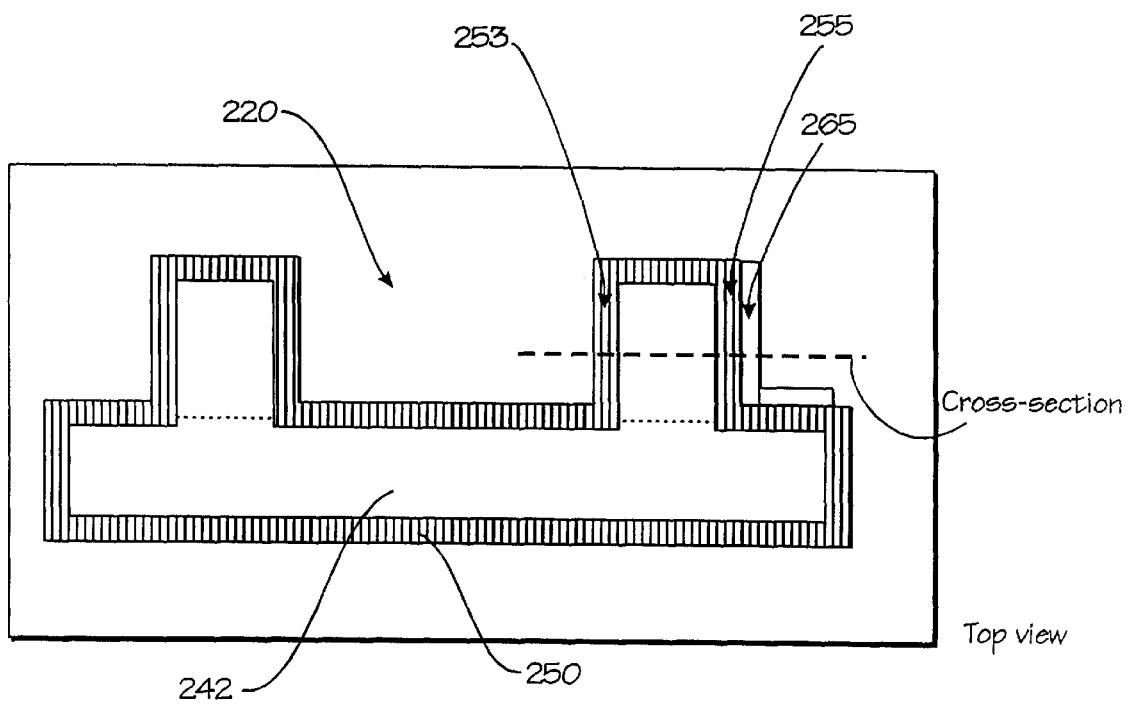

Next, again using the second mask 290, unmasked portions of the polysilicon layer 210 are removed, leaving polysilicon blocks 213 and 215, as shown in FIG. 2k-i and FIG. 2k-2. Polysilicon block 213 is not visible in FIG. 2k-2 because it is hidden by spacer 253. Removing the unmasked portions of the polysilicon layer 210 reveals the gate dielectric 220.

The second mask 290 is subsequently removed and polysilicon block 215 is reduced to what will be the next-to-minimum size transistor gate 216, as shown in FIG. 2l-1. Although two steps for removing the polysilicon have been described, an alternative implementation is possible whereby all of the polysilicon layer 210 not covered by spacer material or hard mask material is removed in a single step following the removal of the second mask 290.

FIG. 2l-2 shows that all of the exposed polysilicon has been removed. The only polysilicon remaining is located beneath the nitride spacer material 250, beneath the silicon dioxide spacer material 265, and beneath the remaining silicon dioxide hard mask 242.

FIG. 2l-1 clearly shows that the thickness of the spacers 253, 255, and 265 determine the length of the polysilicon transistor gates 213 and 216. The thickness of the silicon nitride spacer 253 determines the length of the minimum size gate while the combined thickness of the silicon nitride spacer 255 and the silicon dioxide spacer 265 determine the length of the next-to-minimum size gate.

Figure 2M:
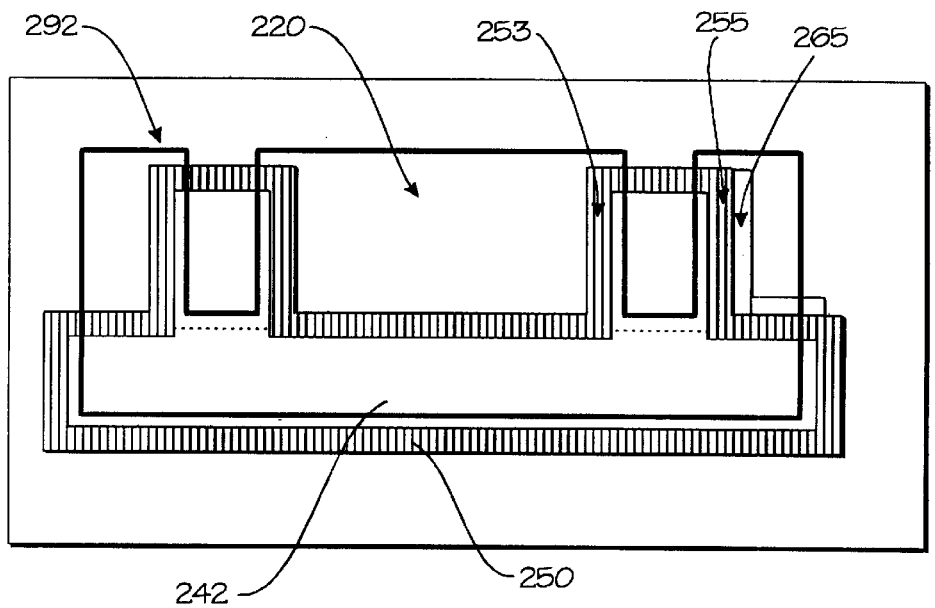
FIG. 2m is a top-view depiction of a trim mask placed over the existing structures in accordance with the teachings of the present invention.
Figure 2N:
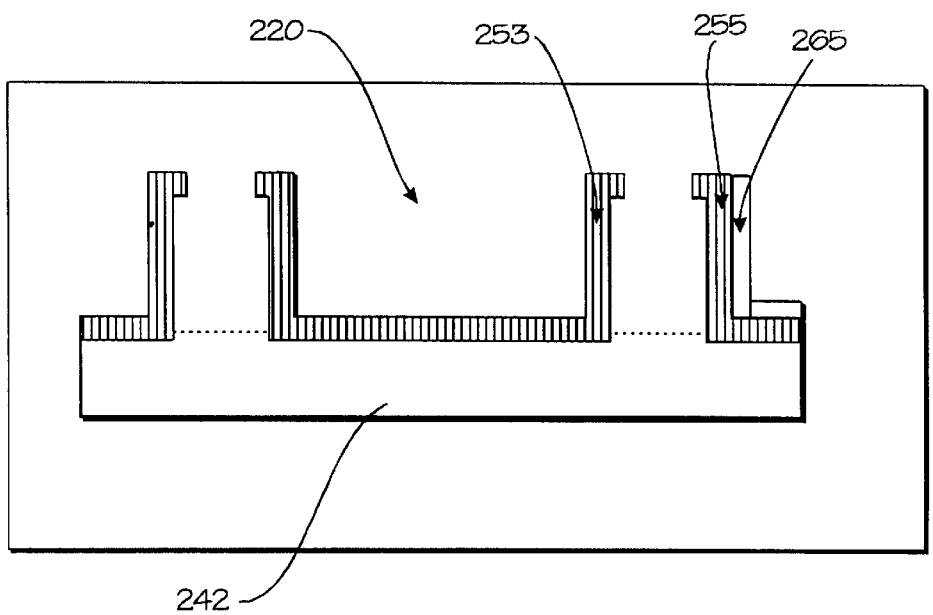
FIG. 2n unwanted first and second spacer material having been removed in accordance with the teachings of the present invention.
Figures 1, 20:
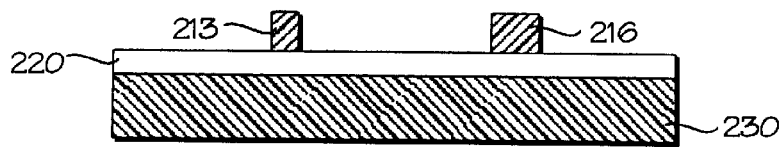
Figures 2, 20:
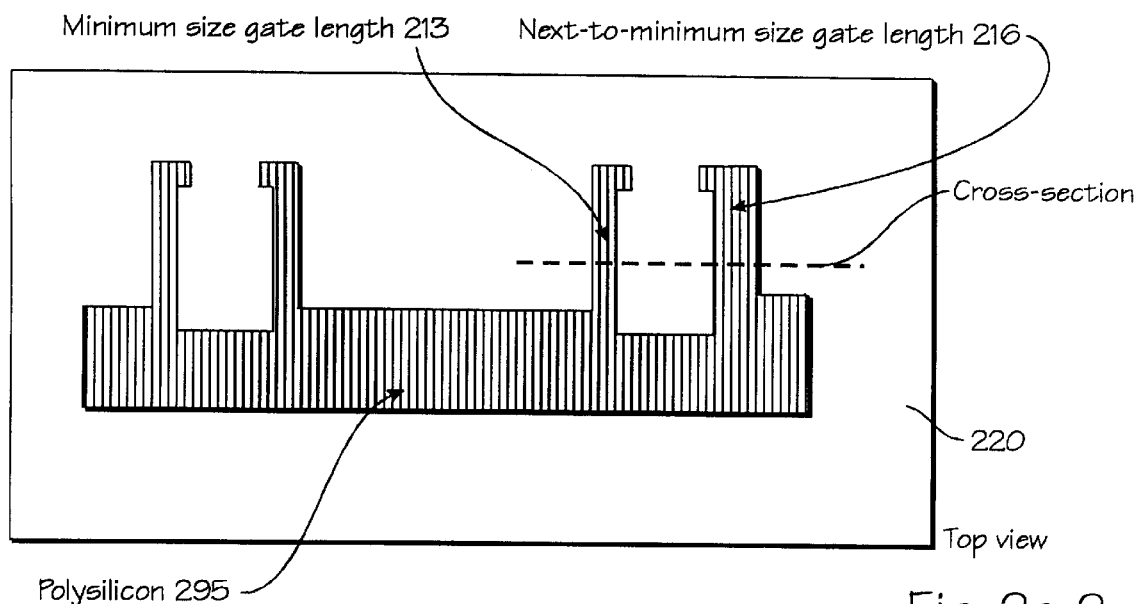

Next, the third or "trim" mask 292, shown in a transparent manner in FIG. 2m, is used to remove unwanted spacer material and unwanted hard mask material. Unwanted portion of the silicon nitride spacer 250, the silicon dioxide spacer 265, and the hard mask 242 are removed, as well as the newly exposed underlying polysilicon. The result is depicted in FIG. 2n.

Finally, spacers 253, 255, and 265 are removed, revealing the final polysilicon gates 213 and 216, as illustrated in FIG. 2o-1 and FIG. 2o-2. The remaining hard mask 242 is also removed, revealing the polysilicon contact area 295. Gate 213 is minimum size, while gate 216 is next-to-minimum size.

Following the formation of the gates, the remaining transistor structures are fabricated using methods well known in the art.

In the foregoing specifications the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded in an illustrative rather than in a restrictive sense.

What is claimed is:

1. A method for forming a minimum size and a next-to-minimum size electrically conductive member using a litho-less process, comprising the steps of:

forming the minimum size electrically conductive member using a first spacer that is formed using a first spacer material, the minimum size electrically conductive member substantially equal in size to the thickness of the first spacer;

forming the next-to-minimum size electrically conductive member using and a second spacer that is formed using the first spacer material and a second spacer material, the next-to-minimum size electrically conductive member substantially equal in size to the thickness of the second spacer.

2. The method of forming a minimum size and a next-to-minimum size electrically conductive member of claim 1, further comprising the step of:

forming a mask whose edges define the location of the first and second spacers.

3. The method of forming a minimum size and a next-to-minimum size electrically conductive member of claim 2, wherein the step of forming a mask whose edges define the location of the first and second spacers is accomplished using a photolithographic process.

4. A method of forming a minimum size and a next-to-minimum size electrically conductive member using a litho-less process, comprising the steps of:

forming a layer of first mask material on a layer of electrically conductive material;

patterning the first mask material to form a first mask using a mask formed using a first photolithographic mask, the first mask having a first edge and a second edge;

forming a layer of first spacer material over the first mask and electrically conductive material;

etching the first spacer material to form a first spacer adjacent to the first edge and a second spacer adjacent to the second edge;

forming a layer of second spacer material over the first spacer, the second spacer, the first mask, and the electrically conductive material;

etching the second spacer material to form a first additional spacer adjacent to the first spacer and a second additional spacer adjacent to the second spacer;

forming a second mask using a second photolithographic mask, the second mask formed in alignment with the second spacer in such a manner that the first mask is exposed and the second additional spacer is protected;

removing the first mask and the first additional spacer;

removing the second mask;

etching the electrically conductive material in alignment with the first spacer, the second spacer, and the second additional spacer; and removing the first spacer, the second spacer, and the second additional spacer.

5. The method of forming a minimum size and a next-to-minimum size electrically conductive member of claim 4, wherein the first mask material comprises silicon dioxide.

6. The method of forming a minimum size and a next-to-minimum size electrically conductive member of claim 4, wherein the electrically conductive material comprises polysilicon.

7. The method of forming a minimum size and a next-to-minimum size electrically conductive member of claim 4, wherein the step of forming a layer of first spacer material further comprises the step of performing a conformal pattern transfer layer deposition of the first spacer material.

8. The method of forming a minimum size and a next-to-minimum size electrically conductive member of claim 7, wherein the step of etching the first spacer material is accomplished by using a reactive ion etching process.

9. The method of forming a minimum size and a next-to-minimum size electrically conductive member of claim 8, wherein the first spacer material comprises silicon nitride.

10. The method of forming a minimum size and a next-to-minimum size electrically conductive member of claim 4, wherein the step of forming a layer of second spacer material further comprises the step of performing a conformal pattern transfer layer deposition of the second spacer material.

11. The method of forming a minimum size and a next-to-minimum size electrically conductive member of claim 10, wherein the step of etching the second spacer material is accomplished by using a reactive ion etching process.

12. The method of forming a minimum size and a next-to-minimum size electrically conductive member of claim 11, wherein the second spacer material comprises silicon dioxide.

13. The method of forming a minimum size and a next-to-minimum size electrically conductive member of claim 12, wherein the first mask and the first additional spacer are removed simultaneously.

* * * * *